(12) United States Patent  
Gupta et al.

(10) Patent No.: US 8,817,381 B2
(45) Date of Patent: Aug. 26, 2014

(54) FULL FIELD MEMBRANE DESIGN FOR NON-ROUND LIQUID LENS ASSEMBLIES

(75) Inventors: Amitava Gupta, Roanoke, VA (US); Urban Schnell, Münchenbuchsee (CH); Karim Haroud, Chavannes sur Moudon (CH); Hans Jaeger, Thunstetten (CH); Lisa Nibauer, Shorts Hills, NJ (US); William Egan, Iselin, NJ (US); Stefan Troller, Sissach (CH); Julien Sauvet, Lyss (CH); Christian Oggenfuss, Münchenbuchsee (DE)

(73) Assignee: Adlens Beacon, Inc., Iselin, NJ (US)

( * ) Notice: Subject to any disclaimer, the term of this patent is extended or adjusted under 35 U.S.C. 154(b) by 0 days.

(21) Appl. No.: 13/407,416

(22) Filed: Feb. 28, 2012

(65) Prior Publication Data

US 2012/0243106 A1 Sep. 27, 2012

Related U.S. Application Data

(63) Continuation-in-part of application No. 12/848,910, filed on Aug. 2, 2010, now Pat. No. 8,414,121.

(60) Provisional application No. 61/251,155, filed on Oct. 13, 2009, provisional application No. 61/447,194, filed on Feb. 28, 2011.

(51) Int. Cl.
*G02B 3/12* (2006.01)

(52) U.S. Cl.
CPC ........................................ *G02B 3/12* (2013.01)
USPC ..................................... 359/665; 351/159.68

(58) Field of Classification Search
CPC .............. G02B 1/06; G02B 3/12; G02B 3/14; G02B 26/004

USPC .......... 359/226.3, 228, 665–667; 351/159.04, 351/159.34, 159.68
See application file for complete search history.

(56) References Cited

U.S. PATENT DOCUMENTS 2,576,581 A 11/1951 Edwards
2,836,101 A 5/1958 De Swart
(Continued)

FOREIGN PATENT DOCUMENTS

| JP | 6 308303 A | 11/1994 |
| WO | WO 01/75510 A1 | 10/2001 |
| WO | WO 2008/063442 A1 | 5/2008 |

OTHER PUBLICATIONS

Borish, Association I.M., *Clinical Refraction*, 3rd Edition, Chapter 26 (pp. 1051-1113), The Professional Press, Inc., Chicago (1970).

(Continued)

*Primary Examiner* — Darryl J Collins
*Assistant Examiner* — Gary O'Neill
(74) *Attorney, Agent, or Firm* — Sterne, Kessler, Goldstein & Fox P.L.L.C.

(57) ABSTRACT

An optical and mechanical design of a sealed, non-round fluid-filled lens capable of providing variation of optical power. The fluid lens includes at least three optical components: at least one mostly rigid optical disc, at least one mostly flexible optical membrane and a layer of a transparent fluid that is in communication via a fluid channel with a reservoir of excess fluid contained in a reservoir that can be accessed to augment the fluid volume inside the fluid lens to change the power of the fluid lens. The fluid lens is capable of providing correction of spherical and astigmatic errors, and utilizes contoured membranes to provide for a substantially constant desired spherical power over a substantially full field of view of a user.

22 Claims, 10 Drawing Sheets

(56) References Cited

U.S. PATENT DOCUMENTS

| | | |
|---|---|---|
| 2,976,766 A | 3/1961 | Bianchi |
| 3,598,479 A | 8/1971 | Wright |
| 3,614,215 A | 10/1971 | Mackta |
| 4,181,408 A | 1/1980 | Senders |
| 4,477,158 A | 10/1984 | Pollock et al. |
| 4,890,903 A | 1/1990 | Treisman et al. |
| 4,913,536 A | 4/1990 | Barnea |
| 5,080,476 A | 1/1992 | Monin |
| 5,138,494 A | 8/1992 | Kurtin |
| 5,182,585 A | 1/1993 | Stoner |
| 5,229,885 A | 7/1993 | Quaglia |
| 5,371,629 A | 12/1994 | Kurtin et al. |
| 5,440,357 A | 8/1995 | Quaglia |
| 5,515,203 A | 5/1996 | Nye |
| 5,563,528 A | 10/1996 | Diba et al. |
| 5,574,598 A | 11/1996 | Koumura et al. |
| 5,636,368 A | 6/1997 | Harrison et al. |
| 5,668,620 A | 9/1997 | Kurtin et al. |
| 5,684,637 A | 11/1997 | Floyd |
| 5,719,397 A | 2/1998 | Hallett et al. |
| 5,731,909 A | 3/1998 | Schachar |
| 5,739,959 A | 4/1998 | Quaglia |
| 5,774,273 A | 6/1998 | Bornhorst |
| 5,790,882 A | 8/1998 | Silver et al. |
| 5,900,921 A | 5/1999 | Min |
| 5,952,846 A | 9/1999 | Silver |
| 5,956,183 A | 9/1999 | Epstein et al. |
| 5,963,048 A | 10/1999 | Harrison et al. |
| 5,973,852 A * | 10/1999 | Task ............................. 359/666 |
| 5,999,328 A | 12/1999 | Kurtin et al. |
| 6,040,947 A | 3/2000 | Kurtin et al. |
| 6,053,610 A | 4/2000 | Kurtin et al. |
| 6,069,742 A | 5/2000 | Silver |
| 6,091,892 A | 7/2000 | Xue et al. |
| 6,188,525 B1 | 2/2001 | Silver |
| 6,246,528 B1 | 6/2001 | Schachar |
| 6,493,151 B2 | 12/2002 | Schachar |
| 6,552,860 B1 | 4/2003 | Alden |
| 6,618,208 B1 | 9/2003 | Silver |
| 6,626,532 B1 | 9/2003 | Nishioka et al. |
| 6,715,876 B2 | 4/2004 | Floyd |
| 6,836,374 B2 | 12/2004 | Esch et al. |
| 6,930,838 B2 | 8/2005 | Schachar |
| 6,992,843 B2 | 1/2006 | Juhala |
| 7,068,439 B2 | 6/2006 | Esch et al. |
| 7,085,065 B2 | 8/2006 | Silver |
| 7,142,369 B2 | 11/2006 | Wu et al. |
| 7,256,943 B1 | 8/2007 | Kobrin et al. |
| 7,261,736 B1 | 8/2007 | Azar |
| 7,324,287 B1 | 1/2008 | Gollier |
| 7,325,922 B2 | 2/2008 | Spivey |
| 7,338,159 B2 | 3/2008 | Spivey |
| 7,342,733 B2 | 3/2008 | Takei |
| 7,369,321 B1 | 5/2008 | Ren et al. |
| 7,382,544 B2 | 6/2008 | Cernasov |
| 7,423,811 B2 | 9/2008 | Silver |
| 7,440,193 B2 | 10/2008 | Gunasekaran et al. |
| 7,453,646 B2 | 11/2008 | Lo |
| 7,475,985 B2 | 1/2009 | Blum et al. |
| 7,580,195 B2 | 8/2009 | Choi et al. |
| 7,580,197 B2 | 8/2009 | Omura et al. |
| 7,594,726 B2 | 9/2009 | Silver |
| 7,604,349 B2 | 10/2009 | Blum et al. |
| 8,136,942 B2 | 3/2012 | Gupta et al. |
| 2004/0240076 A1 | 12/2004 | Silver |
| 2005/0140922 A1 | 6/2005 | Bekerman et al. |
| 2006/0066808 A1 | 3/2006 | Blum et al. |
| 2006/0077562 A1 | 4/2006 | Silver |
| 2006/0164731 A1 | 7/2006 | Wu et al. |
| 2006/0245071 A1 | 11/2006 | George et al. |
| 2006/0250699 A1 | 11/2006 | Silver |
| 2007/0030573 A1 | 2/2007 | Batchko et al. |
| 2007/0211207 A1 | 9/2007 | Lo et al. |
| 2008/0002150 A1 | 1/2008 | Blum et al. |
| 2008/0007689 A1 | 1/2008 | Silver |
| 2008/0008600 A1 | 1/2008 | Silver |
| 2008/0019015 A1 | 1/2008 | Fernandez et al. |
| 2008/0084532 A1 * | 4/2008 | Kurtin ............................. 351/57 |
| 2008/0112059 A1 | 5/2008 | Choi et al. |
| 2008/0218873 A1 | 9/2008 | Batchko et al. |
| 2008/0231963 A1 | 9/2008 | Batchko et al. |
| 2008/0285143 A1 | 11/2008 | Batchko et al. |
| 2008/0316587 A1 | 12/2008 | Tijburg et al. |
| 2009/0021843 A1 | 1/2009 | Obrebski et al. |
| 2009/0052049 A1 | 2/2009 | Batchko et al. |
| 2009/0086331 A1 | 4/2009 | Gunasekaran et al. |
| 2009/0116118 A1 | 5/2009 | Frazier et al. |
| 2009/0128922 A1 | 5/2009 | Justis et al. |
| 2009/0195882 A1 | 8/2009 | Bolle et al. |
| 2009/0213471 A1 | 8/2009 | Silver et al. |
| 2009/0251792 A1 | 10/2009 | Suzuki et al. |
| 2010/0045930 A1 | 2/2010 | Silver et al. |
| 2010/0053543 A1 | 3/2010 | Silver et al. |
| 2010/0208194 A1 | 8/2010 | Gupta et al. |
| 2010/0208195 A1 | 8/2010 | Gupta et al. |
| 2011/0102735 A1 | 5/2011 | Gupta et al. |
| 2011/0249232 A1 | 10/2011 | Senatore et al. |
| 2012/0041553 A1 | 2/2012 | Gupta et al. |

OTHER PUBLICATIONS

Jalie, M., *The Priciples of Ophthalmic Lenses*, 4th Edition, Chapter 18 (pp. 413-468), The Association of Dispensing Opticians, Hazell Watson & Viney Limited, London (1984).

Markoff, J., "Scientists at Work: Stephen Kurtin—Making Eyeglasses That Let Wearers Change Focus on the Fly," *The New York Times*, 3 pages (Aug. 4, 2009).

Tang, S.K.Y. et al., "Dynamically Reconfigurable Liquid-Core Liquid-Cladding Lens in a Microfluidic Channel," *Lab on a Chip*, vol. 8, No. 3, p. 395-401 (Mar. 2008).

International Search Report and Written Opinion, dated Dec. 9, 2010, for PCT Appl. No. PCT/US2010/052362, 15 pages.

Senatore, D. et al., U.S. Appl. No. 13/000,887, filed Dec. 22, 2010, entitled "Fluid Filled Lenses and Mechanisms of Inflation Thereof,".

Supplemental European Search Report for European Patent Appl. No. 10823961.7, dated Mar. 4, 2013, 8 pages.

* cited by examiner

FULL FIELD MEMBRANE DESIGN FOR NON-ROUND LIQUID LENS ASSEMBLIES

CROSS REFERENCE TO RELATED APPLICATIONS

This application is a continuation-in-part of U.S. application Ser. No. 12/848,910, now pending, which claims the benefit of U.S. Provisional Application No. 61/251,155, the disclosures of which are hereby incorporated by reference in their entirety. This application also claims the benefit of U.S. Provisional Application No. 61/447,194, the disclosure of which is also hereby incorporated by reference in its entirety.

BACKGROUND

1. Field

Embodiments of the present invention relate to fluid-filled lenses and in particular to variable fluid-filled lenses.

2. Background Art

Basic fluid lenses have been known since about 1958, as described in U.S. Pat. No. 2,836,101, incorporated herein by reference in its entirety. More recent examples may be found in "Dynamically Reconfigurable Fluid Core Fluid Cladding Lens in a Microfluidic Channel" by Tang et al., Lab Chip, 2008, vol. 8, p. 395, and in WIPO publication WO2008/063442, each of which is incorporated herein by reference in its entirety. These applications of fluid lenses are directed towards photonics, digital phone and camera technology and microelectronics.

Fluid lenses have also been proposed for ophthalmic applications (see, e.g., U.S. Pat. No. 7,085,065, which is incorporated herein by reference in its entirety). In all cases, the advantages of fluid lenses including a wide dynamic range, ability to provide adaptive correction, robustness and low cost have to be balanced against limitations in aperture size, tendency to leak and consistency in performance. The '065 patent, for example, has disclosed several improvements and embodiments directed towards effective containment of the fluid in the fluid lens to be used in ophthalmic applications, although not limited to them (see, e.g., U.S. Pat. No. 6,618,208, which is incorporated by reference in its entirety). Power adjustment in fluid lenses has been effected by injecting additional fluid into a lens cavity, by electrowetting, application of ultrasonic impulse, and by utilizing swelling forces in a cross-linked polymer upon introduction of a swelling agent such as water.

In all cases, there are several key limitations in fluid lens technology that need to be overcome to optimize the commercial appeal of this technology. For example, the thickness of fluid lenses is generally greater than conventional lenses of the same power and diameter. Additionally, it is not currently possible to provide a variation of spherical power as well as astigmatism across the lens optic using fluid lens technology. Nor have fluid lenses been manufactured in any desired shape other than a round shape because of complications introduced in non-uniform expansion of non-round fluid lenses. It is therefore desirable to provide solutions to these limitations so commercialization becomes feasible.

BRIEF SUMMARY

In one embodiment, a fluid-filled lens includes a front rigid lens, a semi-flexible membrane attached to the front rigid lens, and a fluid layer between the front rigid lens and the membrane. In this embodiment, the membrane includes a center disk area configured to provide for a substantially constant spherical power greater than approximately 2.0 diopters over a substantially full field of view of a user. In one embodiment, the full field of view of the user is approximately 50 mm along a horizontal axis from an optical center of the fluid-filled lens. In one embodiment, the cylinder power of the fluid-filled lens is less than 0.50 diopters approximately 20 mm along a horizontal axis from an optical center of the fluid-filled lens. Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
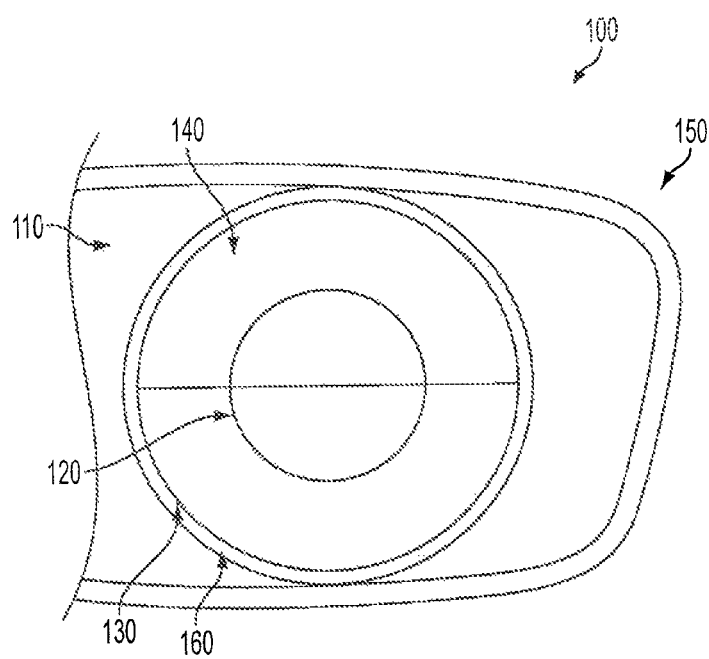
FIG. 1 shows a front view of a portion of a lens according to a first embodiment of the invention.

The present invention will be described with reference to the accompanying drawings.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure or characteristic is described in connection with an embodiment, it would be within the knowledge of one skilled in the art to effect such feature, structure or characteristic in connection with other embodiments whether or not explicitly described.

Throughout this disclosure, the term fluid lens assembly will be used to describe the assembly of a rigid front lens, a flexible membrane and an intervening fluid, while the term fluid lens will be used to denote the fluid layer and the two surfaces containing the fluid and forming the surfaces of the fluid lens. The term inflation is used herein to denote the curving outwards of the membrane when additional fluid is injected into the fluid lens assembly, causing the membrane to stretch out. As discussed herein, there is a direct and proportional relationship between the change in power of a fluid lens and the level of inflation effected. The term optical zone is used to denote a viewing zone in the fluid lens that is centered on an optic axis corresponding to the location of a user's eye. In an exemplary embodiment, the optical zone is approximately 15 mm wide (along the x axis) and approximately 12 mm high (along the y axis), which corresponds to a horizontal gaze angle of about +/−15 degrees and a vertical gaze angle of about +/−12 degrees. The word contoured denotes variation in a mechanical dimension such as thickness, a mechanical property such as sag or an optical property such as astigmatism or power in the x, y plane.

The aspheric fluid lens provided herein includes a mostly rigid optical lens made of glass or plastic, or any other suitable material, a mostly flexible contoured membrane stretched over the edge of the front lens, and a fluid filling the cavity formed between the front lens and the flexible membrane. In an embodiment, this fluid lens is connected via a connecting tube to a reservoir including shaped elastomeric deformable membrane that contains excess fluid. The fluid lens, the connecting tube and the reservoir together form a sealed unit. Provision is made to squeeze the reservoir to push fluid out into the fluid lens through the connecting tube. For example, the provision to squeeze the reservoir may be in the form of a plunger impinging against a diaphragm to increase pressure within the reservoir, a caliper for squeezing the reservoir, or any other fluid pump or actuator known to one of skill in the art. An exemplary sealed unit is disclosed, for example, in U.S. application Ser. No. 12/399,368, which is incorporated by reference herein in its entirety.

As discussed herein, embodiments of the present invention include an improved contoured membrane design derived from a design optimization method that combines optical image analysis with use of finite element software to compute mechanical deflection of the membrane in response to a particular hydrostatic pressure created in the fluid layer. This design method led to a series of membrane thickness contours that enable development of non-round fluid lenses.

FIG. 1 shows a fluid-filled lens according to an embodiment of the present invention. Aspheric fluid lens 100 includes thick zone 110, hinge-like section 160, transition zone 140, and center disk area 120. In an embodiment, thick zone 110 has a thickness of approximately 1 mm, center disk area 120 has a thickness of approximately 0.225 mm and the thickness of transition zone 140 at disk edge 130 is approximately 0.1125 mm. In an embodiment, center disk area 120 has a diameter of approximately 12 mm, and disk edge 130 has a diameter of approximately 23.2 mm. A hinge-like section 160 is formed between thick zone 110 and transition zone 140. The dimensions of this exemplary embodiment provide for a 22 degree gaze angle between the center of center disk area 120 and disk edge 130. In an embodiment, frame 150 is a rounded rectangle, approximately 55 mm by 25 mm in size. This configuration provides for the best optical performance in center disk area 120 while maintaining acceptable properties to the edge of frame 150.

Figure 2:
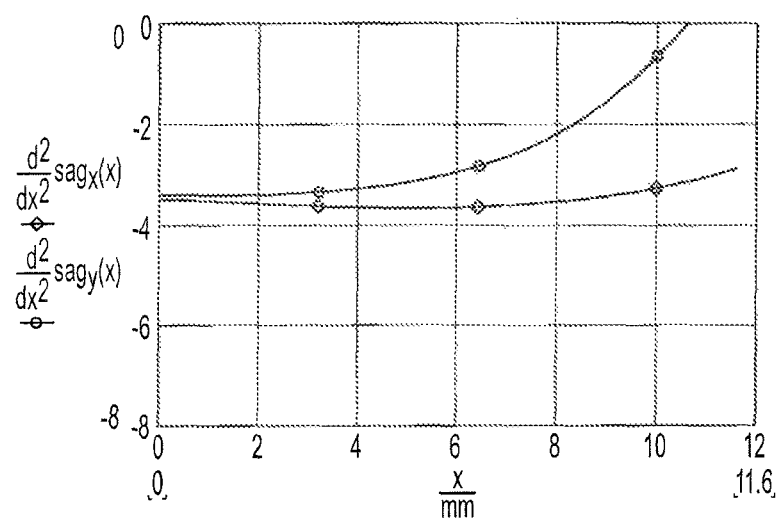
FIG. 2 is a chart showing spherical power value along x and y axes for the embodiment of FIG. 1.

Analysis of the membrane inflation over a 2.00 D power range shows that while the magnitude of inflation of the membrane decreases with increased thickness of lens 100, the membrane surface becomes increasingly aspheric, building up astigmatism. FIG. 2 shows the spherical power of the above embodiment at low inflation pressure (8 mbar) along x and y axes, which demonstrates this divergence.

Figure 3A:
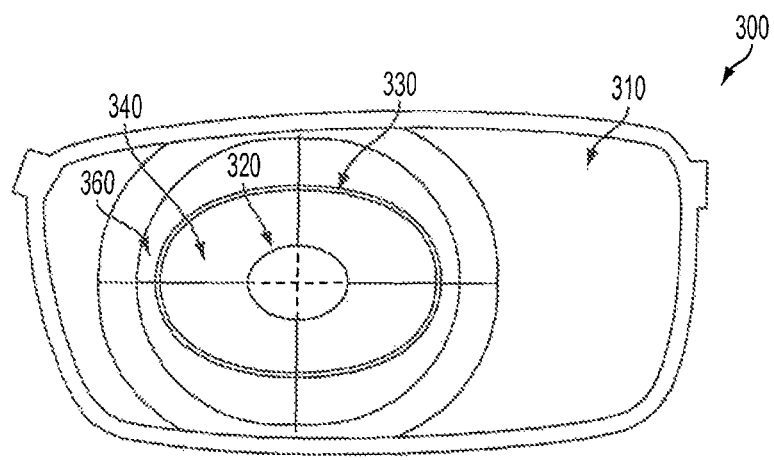
FIG. 3A shows a front view of a lens according to another embodiment of the invention.
Figure 3B:
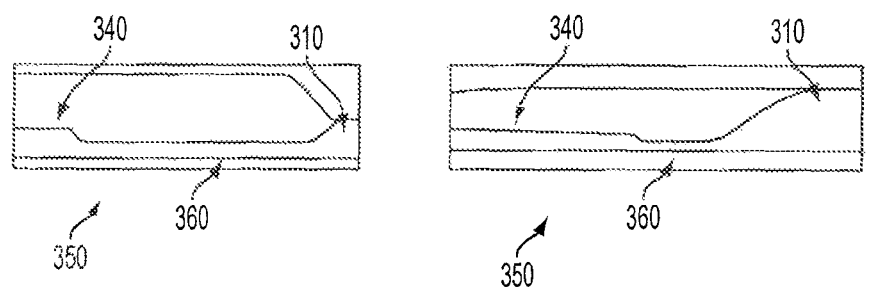
FIG. 3B shows thickness profiles in the y and x directions of the embodiment of FIG. 3A.

FIGS. 3A-3B show a lens 300 according to another embodiment of the present invention, including a contoured design of thickness of membrane 350 Aspheric fluid lens 300 includes thick zone 310, center disk area 320, and disk edge 330. Transition zone 340 is formed between disk edge 330 and center disk area 320. Hinge-like section 360 is located between disk edge 330 and thick zone 310. In an embodiment, center disk area 320, transition zone 340, hinge-like section 360, and disk edge 330 are in the shape of ellipses.

FIG. 3B in particular shows thickness profiles of lens 300 in the y (shown on the left side of FIG. 3B) and x (shown on the right side of FIG. 3B) directions. The purpose of hinge-like section 360 is to allow full inflation of membrane 350 corresponding to the target power range, and yet minimize stresses transferred to peripheral less-flexible thick zone 310 that would cause astigmatism to build. From one perspective, hinge-like section 360 allows sag changes to be "absorbed" without causing optical distortion in both central optical zone within center disk area 320 and peripheral less-flexible thick zone 310 portions of membrane 350.

In an embodiment, central optical zone within center disk area 320 in membrane 350 has a degree of eccentricity of about 0.9. That is, the horizontal width is about 1.11 times bigger than the vertical width. This design pushes the location of the transition zone corresponding to hinge-like section 360 to greater gaze angles in the horizontal direction, where it places lesser constraints upon visual width and horizontal eye movements. In an embodiment, a vertical cross-section thickness is approximately 0.200 mm, a width is approximately 3.7 mm, and an aspect ratio is approximately 1:18.5. In an embodiment, the horizontal cross-section thickness is approximately 0.2 mm, with a corresponding width of approximately 1.45 mm, and an aspect ratio of approximately 1:7.

The use of a hinge section (e.g., hinge-like section 360) which acts as a transition zone makes it possible to effectively isolate optical properties of a membrane (e.g., membrane 350) within individual sections, at a cost of developing an image jump at the hinge section. A hinge having a high aspect ratio, defined as the ratio of the width to its thickness, is particularly effective. In an embodiment, the width is in the range of 0.1 mm to 2.5 mm. In a further embodiment, the range of thickness of the hinge section is 0.01 mm to 0.25 mm. In a still further embodiment, the range of thickness of the hinge section is 0.07 mm to 0.20 mm. For gaze angles that are generally used for near vision (e.g., approximately 0-15 degrees), this configuration will provide for target image quality (e.g., approximately 10 microns, corresponding to approximately 0.5 D of astigmatism, or approximately an equivalent 0.25 D of image blur).

Figure 3C:
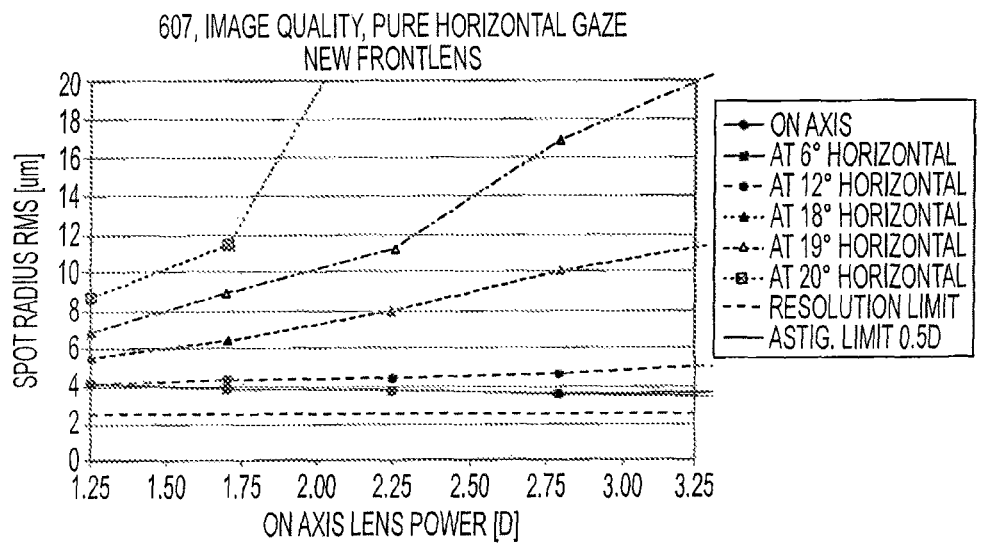
FIG. 3C is a chart showing the retinal image quality as a function of gaze angle in the horizontal direction for the embodiment of FIG. 3A.
Figure 3D:
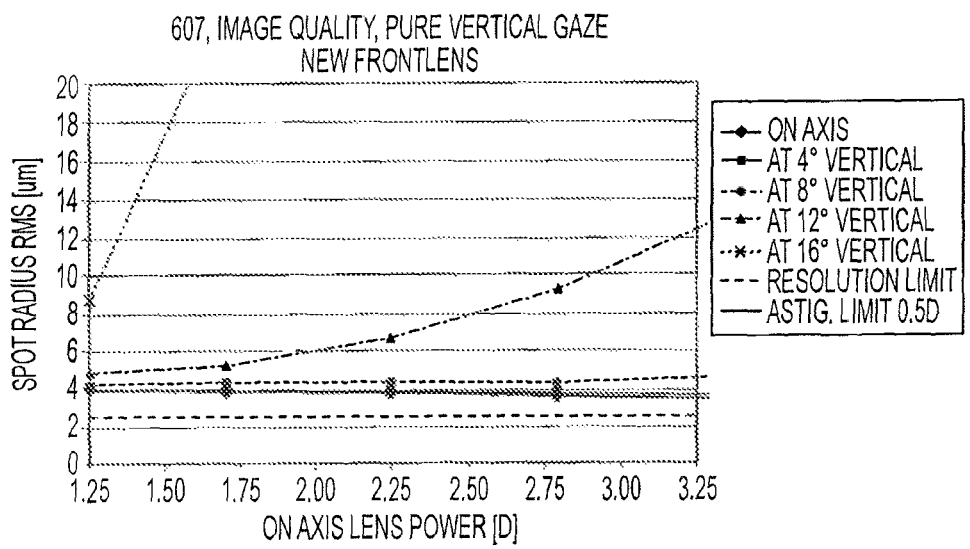
FIG. 3D is a chart showing the retinal image quality as a function of gaze angle in the vertical direction for the embodiment of FIG. 3A.

FIG. 3C is a chart that shows the retinal image quality as a function of gaze angle in the horizontal direction for this embodiment. FIG. 3D is a chart that shows the retinal image quality in the vertical direction for this embodiment. As shown therein, image quality, as a function of spot radius, decreases as the distance from the optical axis increases.

Figure 4A:
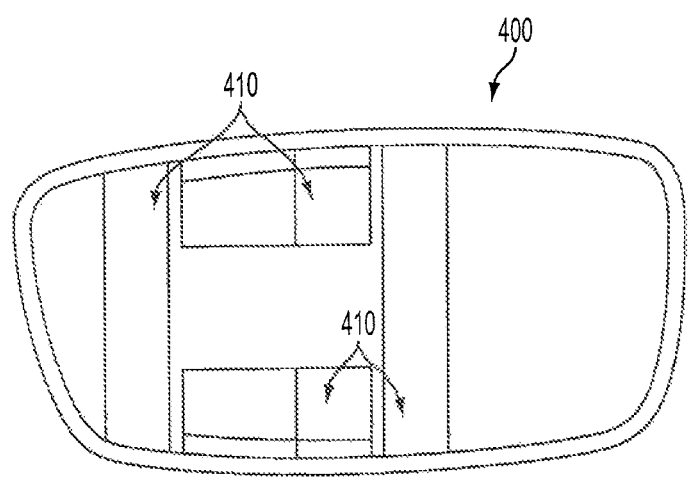
FIG. 4A shows a front view of a lens according to another embodiment of the invention.

FIG. 4A shows another embodiment of the present invention including a lens 400 having a membrane that uses a partial hinge. Forming a hinge of proper aspect ratio that encompasses the entire optical zone may entail manufacturing challenges. To account for this, the embodiment shown in FIG. 4A includes partial hinge 410, which is provided much closer to the frame edge relative to the embodiment shown in FIG. 3A. A partial hinge (e.g., partial hinge 410) has a dual advantage over the hinge design of the embodiment shown in FIG. 3A. The first advantage is that it is easier to mold because it is closer to the edge and is partial in length, rather than a continuous section surrounding the optical zone. The second advantage is that any optical distortion associated with the hinge (such as, for example an image jump) occurs much closer to the frame and is less noticeable by the wearer.

Figure 4B:
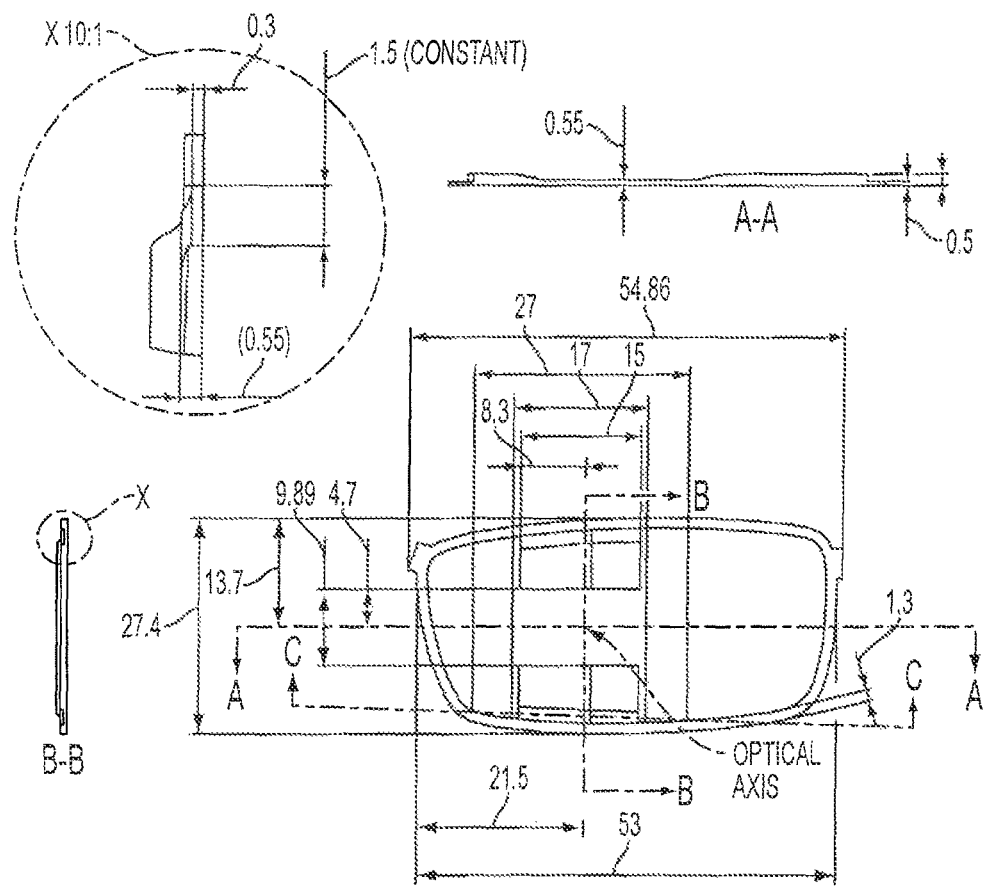
FIG. 4B shows additional views of the embodiment shown in FIG. 4A.

FIG. 4B shows additional views of the embodiment shown in FIG. 4A, including a front view and cross-sectional views of lens 400.

Figure 4C:
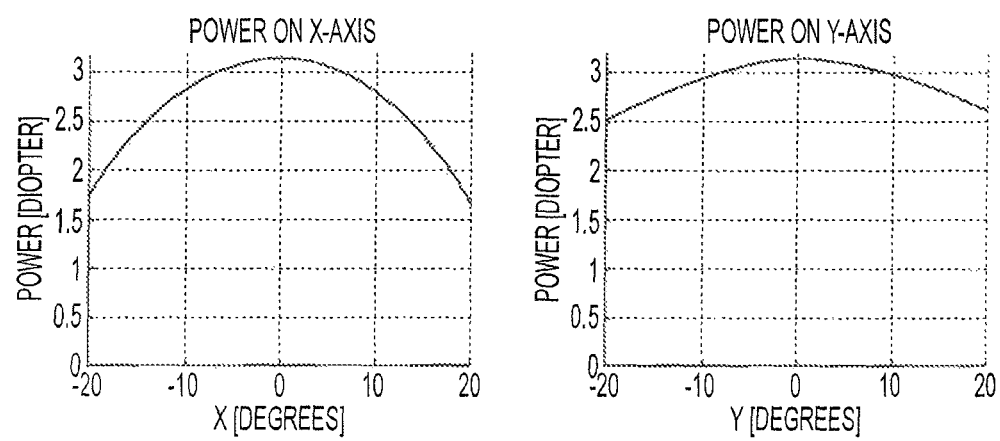
FIG. 4C shows two charts showing surface optical properties of the embodiment of FIG. 4A along the x and y axes.

FIG. 4C is a chart showing a MATLAB analysis of the surface optical properties of the membrane of the embodiment of FIG. 4A, specifically, the power along x and y axes. These results were obtained using polynomials to fit a model having a central elliptical portion whose radius along the x-axis is 13 mm, and radius along the y-axis is 8 mm.

Figure 4D:
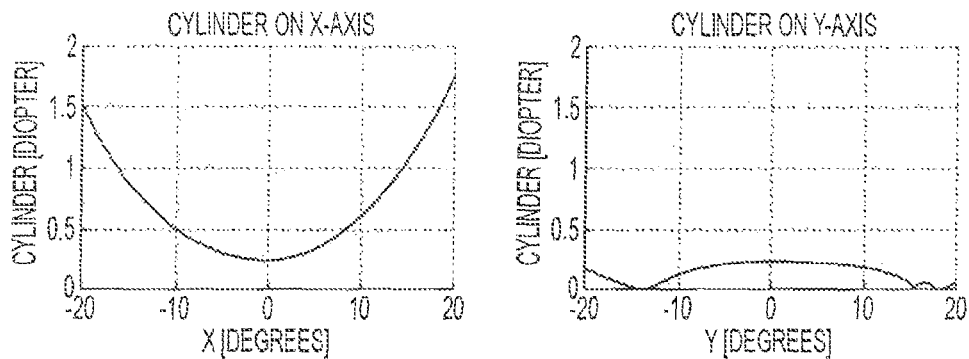
FIG. 4D shows two charts showing astigmatism values of the embodiment of FIG. 4A along the x and y axes

FIG. 4D is a chart showing a MATLAB analysis of astigmatism along x and y axes of the embodiment of FIG. 4A. These results were obtained by applying compensation to the front lens corresponding to the asphericity that develops in the membrane when inflated to one-third of the full range. The compensation is applied simply as a subtraction of sagittal values because the refractive indices are closely similar, and the lens may be modeled as a thin lens. These analyses were performed using extended polynomials to fit an elliptical region covering the central optical zone. The modeled ellipse has a radius of 13 mm on the x-axis and 8 mm on the y-axis, and covers an area of 52 degrees by 32 degrees.

Figure 4E:
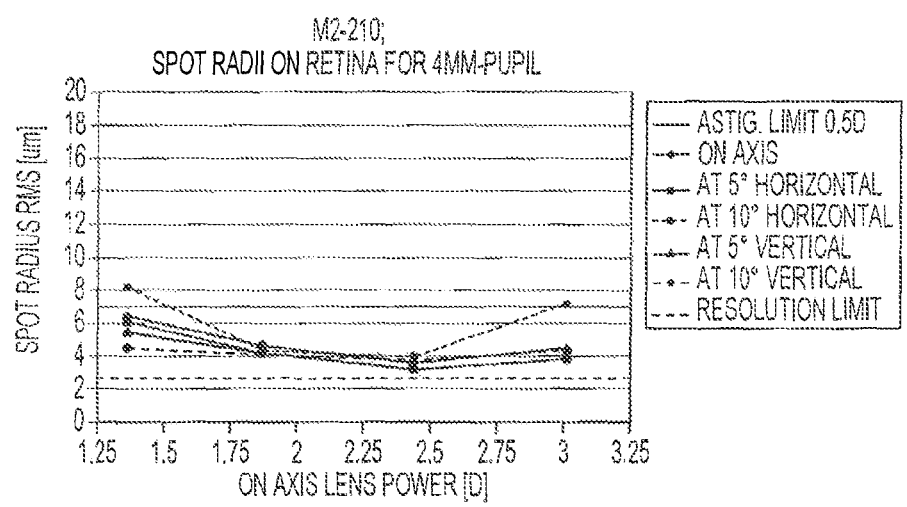
FIG. 4E is a chart showing retinal spot size for the embodiment of FIG. 4A.

FIG. 4E is a chart showing retinal-spot size for the membrane of the embodiment of FIG. 4A working with a compensated front lens. Image quality analysis was performed on ZEMAX for this geometry in association with a compensated front lens. This chart represents a situation with equal correction on both front lens surfaces (null lens). It shows that the astigmatism and other optical aberrations causing a broadening of the retinal spot is maintained under control and less than approximately 0.5 D of astigmatism (equivalent to approximately 0.25 D of image blur) for gaze angles of up to 10 degrees at both horizontal and vertical directions. This analysis was performed using a grid sag representation covering the full membrane.

Method and Experimental Results

Figure 5:
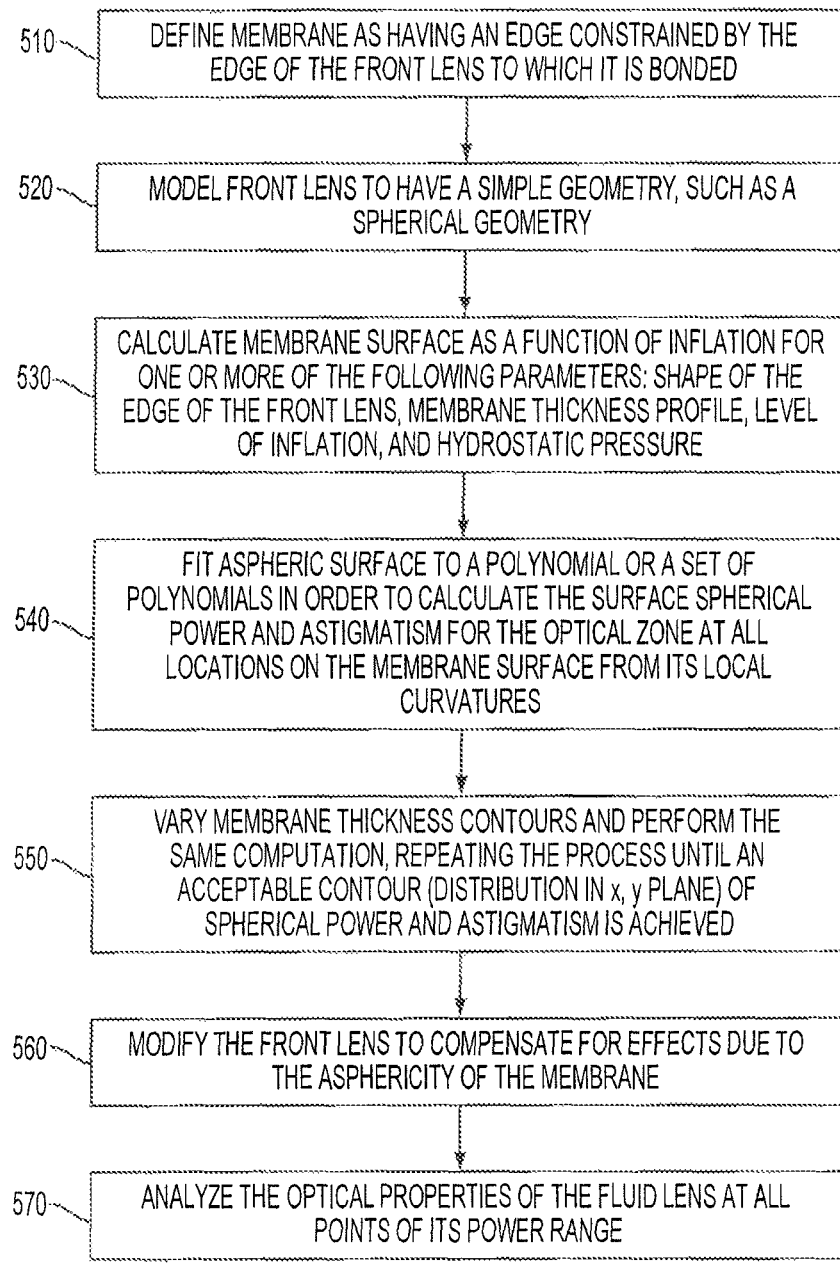
FIG. 5 is a flowchart showing a method of designing a lens according to an embodiment of the invention.

FIG. 5 is a flowchart showing a method of designing a lens according to an embodiment of the invention.

First, in step 510, a membrane is defined as having an edge constrained by the edge of the front lens to which it is bonded. Therefore, when the membrane is inflated by increasing hydrostatic pressure of the fluid, the surface of the membrane acquires an aspheric shape. In an experimental embodiment performed by the inventors, this shape was modeled and predicted using a finite element software package such as COMSOL.

Next, in step 520, in order to predict the inflation of the membrane, the front lens is given a simple geometry for this computation, such as a spherical geometry. In an experimental embodiment performed by the inventors, a front lens of zero power in which both surfaces were spherical was used.

In step 530, the membrane surface is calculated as a function of inflation for one or more of the following parameters: shape of the edge of the front lens, membrane thickness profile, level of inflation, and hydrostatic pressure. In an embodiment, a finite element software program can be used to calculate the membrane surface. In an experimental embodiment performed by the inventors, COMSOL was used.

In step 540, the aspheric surface is analyzed by fitting it to a polynomial or a set of polynomials in order to calculate the surface spherical power and astigmatism for the optical zone at all locations on the membrane surface from its local curvatures. In an experimental embodiment performed by the inventors, this analysis was carried out using the commercially available software package MATLAB. In step 550, the membrane thickness contours can be varied and the same computation performed, repeating the process until an acceptable contour (distribution in x, y plane) of spherical power and astigmatism has been achieved. Power, as used herein, means spherical power or average spherical power, and is measured as $\frac{1}{2}[\partial^2/\partial x^2(Cx,y)+\partial^2/\partial y^2(Cx,y)]$. Acceptable contours of power and astigmatism of the membrane surface are deduced from both experience and the desired optical performance at various levels of the power range of the fluid lens assembly being targeted.

Next, in step 560, the front lens is modified to compensate for effects due to the asphericity of the membrane. This compensation can be carried out at any level of inflation. For the special case when the refractive index of the fluid is approximately equal to the refractive index of the front lens material, this compensation can be reduced to a point-by-point subtraction of membrane sagittal thickness from the front lens. In an experimental embodiment performed by the inventors, further modeling work on COMSOL showed that the departure from a spherical shape was relatively linear with the level of inflation at moderate levels of inflation for the membrane, indicating that if the compensation process is carried out at an inflation level corresponding to the midpoint of the desired range of optical powers of the fluid lens, it would be possible to achieve a symmetrical change in optical performance of the fluid lens through the overall range of powers, being worst at the lowest and highest end points of the power range.

The compensation will be the lowest if carried out at the lowest end of the power range, and maximum if carried out at the highest end of the power range because the asphericity of the membrane surface increases with the level of inflation. In an experimental embodiment performed by the inventors, this compensation process was initially performed at the midpoint of the power range. Subsequently, this compensation process was performed at 33% inflation level, corresponding to an increase in power equal to 33% of the full range. The selection of the power level at which compensation is applied depends on the desired relative quality of the fluid lens at various points of its power range.

It should be noted that the compensation may alternatively be carried out by adjusting either one or both surfaces of the front lens. However, the contribution of the back surface of the front lens to the optical properties of the fluid lens is dependent on the difference in refractive indices of the front lens material and the fluid. In cases where they are closely similar, the front surface alone can be used for modification in order to provide compensation. This has the advantage of reducing tooling time and cost. Use of the same correction on both surfaces (null lens) allows for uniform front thickness over the full range. It should also be noted that this correction adds to aspheric corrections made in order to compensate gaze angle induced cylinder.

Once the compensation has been computed as described above, in step 570, the optical properties of the fluid lens at all points of its power range is analyzed. In an experimental embodiment performed by the inventors, ZEMAX, which is a commercially available software package, was used for this purpose. For the special case where the refractive index of the front lens is approximately equal to the refractive index of the fluid which is also equal to the refractive index of the membrane material, it is possible to reduce the front lens to one refracting surface, treat the membrane as the second surface, and use the common refractive index and the overall sagittal thickness to set up the lens to be modeled. In an experimental embodiment performed by the inventors, the front lens was treated as a separate entity, allowing for different refractive indices for the front lens and the fluid. Retinal image quality was calculated using an eye model, and expressed as image-spot size. It was calculated along selected meridians of the fluid lens and for a range of gaze angles.

This whole process with several iterative steps built in may be termed a design tool chain to efficiently optimize the thickness contours of the membrane in order to achieve the best image quality. In an experimental embodiment performed by the inventors, because a set of three software packages were used to perform the computation of inflation and optical properties of the lens, efficient methods were developed to export data from one software package to the next, eventually automating this data transfer process, and performing optimization at intermediate points. It is desirable to provide for the efficient exporting of data from one software package to another, development of mathematical simulations of surfaces for efficient operation of the FEM and the ray tracing analyses programs, and creation of a merit function that defines the allowable level of astigmatic or other forms of image aberration as a function of gaze angle along specific meridians.

Another design element involves the relative magnitudes of refractive indices of the various optical elements involved in the fluid lens, the front lens, the fluid and the membrane. Of these, the refractive index of the membrane does not significantly affect the power of the fluid lens, but it has an effect on the visibility and cosmetics of the thickness contours that may be added to the membrane, as well as internal reflection from the inner surface of the membrane. These two undesirable features were minimized in an experimental embodiment performed by the inventors by ensuring that the refractive index of the membrane material was approximately equal to the refractive index of the oil, especially at the sodium D line of the spectrum. In an embodiment, a difference of 0.02 units or less may be used. In an embodiment, the refractive index of the fluid should be as high as possible in order to minimize the magnitude of inflation required to achieve a certain increase in optical power. In an experimental embodiment performed by the inventors, the refractive index of the front lens was matched to the refractive index of the fluid to neutralize the optical contribution of the inner surface of the front lens and make the design simpler and more robust.

The foregoing non-limiting examples demonstrate the use of the design tool chain in creating and optimizing membrane geometry for a particular frame shape and a desired range of power that needs to be covered by the fluid lens assembly.

Additional Embodiments

Figure 6:
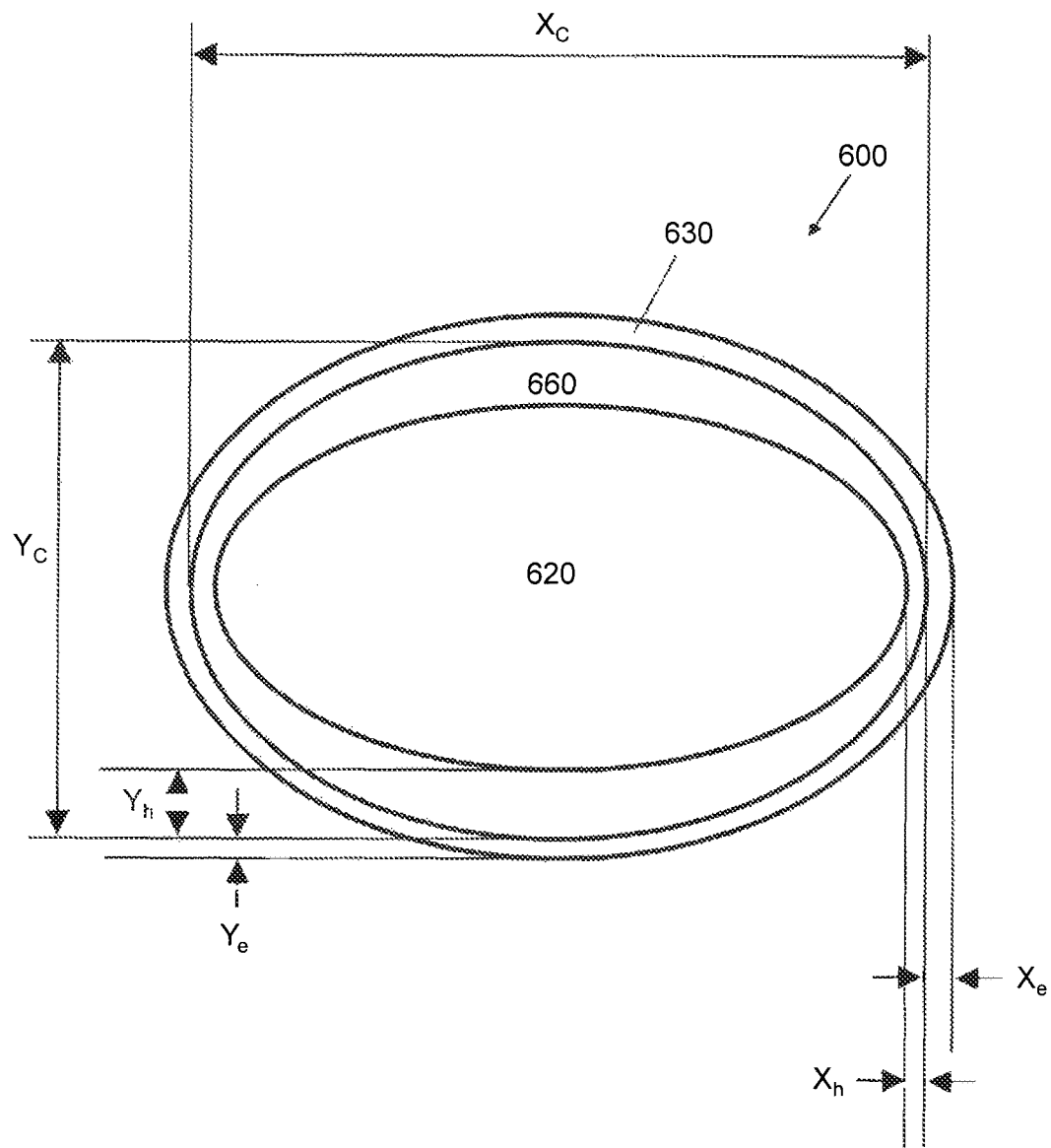
FIG. 6 shows a front view of a lens according to an embodiment of the invention.

FIG. 6 shows a front view of a fluid-filled lens 600 according to one embodiment of the present invention. Lens 600 can, for example, be a component of a fluid-filled lens having a front rigid lens, a semi-flexible membrane attached to the front rigid lens, and a fluid layer between the front rigid lens and the membrane. The semi-flexible membrane can include a center disk area 620 configured to provide for a substantially constant spherical power greater than approximately 2.0 diopters over a substantially full field of view of a user along the horizontal axis. For example, the full field of view of the user can be approximately 50 mm along the horizontal axis centered at an optical center of lens 600.

Like the embodiments described herein, lens 600 includes a disk edge section 630, and a hinge-like section 660 located between disk edge 630 and center disk area 620. In this embodiment, center disk area 620, hinge-like section 660, and disk edge section 630 are in the shape of ellipses, with disk edge section 630 extending to the edge of lens 600. Center disk area 620 corresponds to a viewing zone centered on an optical axis of a user's eye. Center disk area 620 can be configured to provide for a desired range of spherical power over a substantially full field of view of the user along the horizontal axis and/or the vertical axis.

Length $X_c$, which is shown in FIG. 6, corresponds to a total length of hinge-like section 660 along the horizontal axis. Length $Y_c$ corresponds to a total length of hinge-like section 660 along the vertical axis. Length $X_h$ corresponds to a width of hinge-like section 660 along the horizontal axis and length $Y_h$ corresponds to a width of hinge-like section 660 along the vertical axis. Length $X_e$ corresponds to a width of disk edge section 630 along the horizontal axis and length $Y_e$ corresponds to a width of disk edge section 630 along the vertical axis.

In some embodiments, $X_h$ and $Y_h$ can range from approximately 1.0 mm to approximately 4.0 mm, and in some embodiments can range from approximately 2.0 mm to approximately 3.0 mm. In some embodiments, the thickness of hinge-like section 660 can range from approximately 0.005 mm to approximately 0.020 mm, and in some embodiments can range from approximately 0.005 mm to approximately 0.015 mm.

In one embodiment, the total length of lens 600 is approximately 54 mm along the horizontal axis and approximately 34 mm along the vertical axis, $X_c$ is approximately 50 mm, $Y_c$ is approximately 30 mm, $X_h$ is approximately 0.1 mm and $Y_h$ is approximately 4.0 mm, $X_e$ is approximately 2 mm and $Y_e$ is approximately 2 mm. The thickness of center disk area 620 is approximately 0.55 mm, the thickness of hinge section 660 can be approximately 0.025 mm or approximately 0.010 mm, and the thickness of disk edge 630 is approximately 1 mm.

In another embodiment, $X_h$ is approximately 0.1 mm and $Y_h$ is approximately 4.0 mm, with a hinge thickness of approximately 0.010 mm. In this embodiment, the change in the volume of oil between an inflated state and an uninflated state ($\Delta V$) is approximately 863 mm$^3$. In this embodiment, in an inflated state the spherical power of the fluid-filled lens ranges from approximately 1.75 diopters to approximately 2.5 diopters approximately 20 mm along a horizontal axis from an optical center of the fluid-filled lens and from approximately 1.5 diopters to approximately 2.5 diopters approximately 10 mm along a vertical axis from the optical center. The cylinder power in an inflated state is from approximately 0.0 diopters to approximately 0.50 diopters approximately 20 mm along a horizontal axis from an optical center of the fluid-filled lens and from approximately 0.0 diopters to approximately 0.5 diopters approximately 5 mm from the optical center.

In another embodiment, $X_h$ is approximately 0.1 mm and $Y_h$ is approximately 4.0 mm, with a hinge thickness of approximately 0.025 mm and a $\Delta V$ of approximately 786 mm$^3$. In this embodiment, in an inflated state the spherical power of the fluid-filled lens ranges from approximately 1.75 diopters to approximately 2.25 diopters approximately 20 mm along a horizontal axis from an optical center of the fluid-filled lens and from approximately 1.25 diopters to approximately 2.25 diopters approximately 10 mm along a vertical axis from the optical center. The cylinder power in an inflated state is from approximately 0.0 diopters to approximately 0.50 diopters approximately 20 mm along a horizontal axis from an optical center of the fluid-filled lens and from approximately 0.0 diopters to approximately 0.5 diopters approximately 5 mm from the optical center.

In another embodiment, $X_h$ is approximately 0.1 mm and $Y_h$ is approximately 2.0 mm, with a hinge thickness of approximately 0.010 mm and a $\Delta V$ of approximately 639 mm$^3$. In this embodiment, in an inflated state the spherical power of the fluid-filled lens ranges from approximately 1.75 diopters to approximately 2.25 diopters approximately 20 mm along a horizontal axis from an optical center of the fluid-filled lens and from approximately 1.5 diopters to approximately 2.25 diopters approximately 10 mm along a vertical axis from the optical center. The cylinder power in an inflated state is from approximately 1.0 diopters to approximately 1.50 diopters approximately 20 mm along a horizontal axis from an optical center of the fluid-filled lens and from approximately 0.0 diopters to approximately 1.0 diopters approximately 10 mm from the optical center.

In another embodiment, $X_h$ is approximately 0.1 mm and $Y_h$ is approximately 2.0 mm, with a hinge thickness of approximately 0.025 mm and a $\Delta V$ of approximately 594 mm$^3$. In this embodiment, in an inflated state the spherical power of the fluid-filled lens ranges from approximately 1.25 diopters to approximately 2.25 diopters approximately 20 mm along a horizontal axis from an optical center of the fluid-filled lens and from approximately 1.5 diopters to approximately 2.25 diopters approximately 10 mm along a vertical axis from the optical center. The cylinder power in an inflated state is from approximately 1.0 diopters to approximately 1.50 diopters approximately 20 mm along a horizontal axis from an optical center of the fluid-filled lens and from approximately 0.0 diopters to approximately 1.25 diopters approximately 10 mm from the optical center.

In another embodiment, $X_h$ is approximately 0.1 mm and $Y_h$ is approximately 3.0 mm, with a hinge thickness of approximately 0.010 mm and a $\Delta V$ of approximately 735 mm$^3$. In this embodiment, in an inflated state the spherical power of the fluid-filled lens ranges from approximately 1.5 diopters to approximately 2.25 diopters approximately 20 mm along a horizontal axis from an optical center of the fluid-filled lens and from approximately 1.5 diopters to approximately 2.25 diopters approximately 10 mm along a vertical axis from the optical center. The cylinder power in an inflated state is from approximately 0.5 diopters to approximately 1.0 diopters approximately 20 mm along a horizontal axis from an optical center of the fluid-filled lens and from approximately 0.0 diopters to approximately 1.0 diopters approximately 10 mm from the optical center.

Some embodiments described herein show a relatively stable level of spherical power and astigmatism along the horizontal axis, with a relatively shorter range of spherical power and astigmatism along the vertical axis. As one example, the lens can be configured such that the spherical power varies less than approximately 0.25 diopters over approximately 10 mm (+/−5 mm) from the optical center, and preferably over approximately 20 mm (+/−10 mm) from the optical center. In some embodiments, the spherical power and/or astigmatism along the vertical axis can have an equal or greater range compared to the horizontal axis. Another measure of optical performance can be the magnitude of induced astigmatism along the horizontal axis. In some embodiments, induced astigmatism can be less than approximately 0.5 diopters over at least approximately 10 mm along the horizontal axis (+/−5 mm) from the optical center, and in some embodiments, over approximately 20 mm (+/−10 mm) from the optical center.

In addition, the rigid lens of one or more of the fluid assemblies described herein can include a compensation to a front or back surface to provide a desired optical power at a predetermined level of inflation. The compensation of the rigid lens can, for example, be designed based on the geometry of the membrane and/or desired level of inflation. Hinge width, among other design parameters, can be adjusted as desired. For example, in some embodiments, a combination of a wider hinge along the Y-axis ($Y_h$) and a thinner hinge along the horizontal axis ($X_h$) can reduce astigmatism induced by inflation.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

Further, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way.

What is claimed is:

1. A fluid-filled lens assembly, comprising:
a front rigid lens;
a semi-flexible membrane including a thick zone, a hinge section, and a center disk area configured to provide for a substantially constant spherical power greater than approximately 2.0 diopters over a substantially full field of view of a user attached to the front rigid lens; and
a fluid layer between the front rigid lens and the membrane, wherein each of the hinge section, the thick zone, and the center disk area has a different thickness.

2. The fluid-filled lens assembly of claim 1, wherein the full field of view of the user is approximately 50 mm along a horizontal axis from an optical center of the fluid-filled lens.

3. The fluid-filled lens assembly of claim 1, wherein a cylinder power of the fluid-filled lens is less than 0.50 diopters approximately 20 mm along a horizontal axis from an optical center of the fluid-filled lens.

4. The fluid-filled lens assembly of claim 1, wherein a cylinder power of the fluid-filled lens is less than 0.50 diopters approximately 5 mm along a vertical axis from an optical center of the fluid-filled lens.

5. The fluid-filled lens assembly of claim 1, wherein the membrane includes a hinge section having a width from approximately 1.0 mm to approximately 4.0 mm.

6. The fluid-filled lens assembly of claim 1, wherein the hinge section comprises a width from approximately 2.0 mm to approximately 3.0 mm.

7. The fluid-tilled lens assembly of claim 1, wherein the hinge section comprises a thickness from approximately 0.005 mm to approximately 0.020 mm.

8. The fluid-filled lens assembly of claim 1, wherein the hinge section comprises a thickness from approximately 0.005 mm to approximately 0.015 mm.

9. The fluid-tilled lens assembly of claim 1, wherein the hinge section comprises an outside edge approximately 1.0 mm from the edge of the front rigid lens.

10. The fluid-filled lens assembly of claim 1, wherein the front lens is configured to substantially cancel out an asphericity of the membrane at a particular stage of inflation of the membrane, wherein the particular stage of inflation is within an overall range of pre-defined power.

11. The fluid-filled lens assembly of claim 10, wherein the particular stage of inflation is at one third of full inflation of the membrane.

12. The fluid-filled lens assembly of claim 1, wherein a thickness of the membrane increases along a horizontal axis towards a distal end of the fluid lens.

13. The fluid-filled lens assembly of claim 1, wherein the front lens has a refractive index within 0.02 units of a refractive index of the fluid.

14. The fluid-filled lens assembly of claim 1, wherein the membrane has a refractive index within 0.02 units of a refractive index of the fluid.

15. The fluid-filled lens assembly of claim 1, wherein the membrane includes a plurality of hinge-like sections.

16. The fluid-filled lens assembly of claim 15, wherein the plurality of hinge-like sections includes two horizontally aligned sections and two vertically aligned sections.

17. The fluid-filled lens assembly of claim 1, wherein the hinge section is adjacent the center disk area.

18. The fluid-filled lens assembly of claim 1, wherein the hinge section at least partially surrounds the center disk area.

19. The fluid-filled lens assembly of claim 1, wherein the thickness of the hinge section is less than the thickness of at least one of the thick zone and the center disk area.

20. The fluid-filled lens assembly of claim 1, wherein an aspect ratio of the hinge section is different than an aspect ratio of at least one of the thick zone and the center disk area.

21. The fluid-filled lens assembly of claim 1, wherein the thick zone at least partially surrounds the hinge section.

22. A fluid-filled lens, comprising:
   a front rigid lens;
   a semi-flexible membrane including an integral hinge section and a center disk area configured to provide for a substantially constant spherical power over a substantially full field of view of a user attached to the front rigid lens; and
   a fluid layer between the front rigid lens and the semi-flexible membrane.

\* \* \* \* \*